(12) United States Patent
Jeon

(10) Patent No.: US 9,496,863 B2
(45) Date of Patent: Nov. 15, 2016

(54) POWER GATING CIRCUIT AND INTEGRATED CIRCUIT

(71) Applicant: SAMSUNG ELECTRONICS CO., LTD., Suwon-Si, Gyeonggi-Do (KR)

(72) Inventor: Jae-Han Jeon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 14/616,824

(22) Filed: Feb. 9, 2015

(65) Prior Publication Data

US 2015/0280703 A1 Oct. 1, 2015

(30) Foreign Application Priority Data

Mar. 27, 2014 (KR) .................... 10-2014-0035652

(51) Int. Cl.
*H03K 17/16* (2006.01)
*H03K 17/687* (2006.01)
*G05F 1/46* (2006.01)

(52) U.S. Cl.
CPC ........ *H03K 17/165* (2013.01); *H03K 17/6871* (2013.01); *G05F 1/465* (2013.01)

(58) Field of Classification Search
USPC ........................................................ 327/544
See application file for complete search history.

(56) References Cited

U.S. PATENT DOCUMENTS

| | | | | |
|---|---|---|---|---|
| 5,144,165 | A * | 9/1992 | Dhong | H03K 19/00315 326/33 |
| 5,966,044 | A * | 10/1999 | Naka | H03K 19/01721 327/535 |
| 6,329,874 | B1 * | 12/2001 | Ye | G05F 3/205 327/390 |
| 6,864,708 | B2 * | 3/2005 | Takahashi | G11C 5/14 326/33 |
| 7,102,254 | B2 * | 9/2006 | Veendrick | H03K 19/0016 307/126 |
| 7,256,608 | B2 | 8/2007 | Ranganathan et al. | |
| 7,274,247 | B2 * | 9/2007 | Ward | H03K 19/0027 327/534 |
| 7,639,039 | B2 | 12/2009 | Oh | |
| 7,701,245 | B1 * | 4/2010 | Vasudevan | H03K 19/173 326/33 |
| 7,978,001 | B2 * | 7/2011 | Bertram | H03K 19/0013 327/534 |
| 8,008,733 | B2 | 8/2011 | Nakai | |
| 8,063,692 | B2 | 11/2011 | Okano | |
| 8,299,847 | B2 * | 10/2012 | Matano | G06F 1/189 327/534 |
| 8,456,140 | B2 | 6/2013 | Patil et al. | |
| 8,462,562 | B1 | 6/2013 | Goel et al. | |
| 2004/0070427 | A1 * | 4/2004 | Miyagi | H03K 19/0016 327/100 |
| 2004/0130387 | A1 * | 7/2004 | Marshall | H03K 19/0016 327/544 |
| 2008/0238526 | A1 * | 10/2008 | Penev | H03K 17/162 327/389 |
| 2008/0284504 | A1 * | 11/2008 | Hirota | H03K 19/0016 327/544 |
| 2009/0146734 | A1 | 6/2009 | Fallah et al. | |
| 2013/0069690 | A1 | 3/2013 | Kim et al. | |

FOREIGN PATENT DOCUMENTS

KR 0964920 B 6/2010
KR 1293316 B 7/2013

* cited by examiner

*Primary Examiner* — Thomas J Hiltunen
(74) *Attorney, Agent, or Firm* — Volentine & Whitt, PLLC

(57) ABSTRACT

A power gating circuit in an integrated circuit, including a circuit block coupled to a virtual power supply line, includes a first transistor and a buffer. The first transistor is coupled between a first power supply line and the virtual power supply line, and has a body coupled to the first power supply line. The buffer buffers a control signal to apply the buffered control signal to the first transistor, and includes a second transistor having a source coupled to a second power supply line and a body coupled to the first power supply line.

14 Claims, 12 Drawing Sheets

POWER GATING CIRCUIT AND INTEGRATED CIRCUIT

CROSS-REFERENCE TO RELATED APPLICATIONS

This U.S. non-provisional application claims the benefit of priority under 35 U.S.C. §119 to Korean Patent Application No. 10-2014-0035652 filed on Mar. 27, 2014 in the Korean Intellectual Property Office (KIPO), the entire contents of which are incorporated by reference herein in their entireties.

BACKGROUND

1. Technical Field

Example embodiments relate generally to semiconductor devices and, more particularly, to power gating circuits and integrated circuits including the power gating circuits.

2. Description of the Related Art

A power gating circuit is widely used to reduce power consumption in an integrated circuit. The power gating circuit may cut off the power supply to a circuit block operating in a sleep mode, thereby reducing a leakage current. However, in a conventional power gating circuit, a leakage current through a power cut-off switch may occur even in the sleep mode, which results in undesired power consumption.

SUMMARY

Some example embodiments provide a power gating circuit capable of reducing power consumption with a small circuit size.

Some example embodiments provide an integrated circuit including a power gating circuit capable of reducing power consumption with a small circuit size.

According to example embodiments, a power gating circuit in an integrated circuit, including a circuit block coupled to a virtual power supply line, includes a first transistor and a buffer. The first transistor is coupled between a first power supply line and the virtual power supply line, and has a body coupled to the first power supply line. The buffer buffers a control signal to apply the buffered control signal to the first transistor. The buffer includes a second transistor having a source coupled to a second power supply line and a body coupled to the first power supply line.

In some example embodiments, a first high power supply voltage may be applied to the first power supply line, and a second high power supply voltage which is greater than the first high power supply voltage may be applied to the second power supply line.

In some example embodiments, a first low power supply voltage may be applied to the first power supply line, and a second low power supply voltage which is less than the first low power supply voltage may be applied to the second power supply line.

In some example embodiments, a voltage difference between a first power supply voltage applied to the first power supply line and a second power supply voltage applied to the second power supply line may be selected based on a leakage current of the first transistor and a leakage current of the buffer.

In some example embodiments, the first transistor and the second transistor may be formed at the same well of a semiconductor substrate.

In some example embodiments, the first transistor may be configured to selectively couple the first power supply line to the virtual power supply line in response to the buffered control signal.

In some example embodiments, the first transistor may further have a source coupled to the first power supply line, a drain coupled to the virtual power supply line, and a gate configured to receive the buffered control signal from the buffer.

In some example embodiments, the buffer may be configured to apply a power supply voltage of the second power supply line as the buffered control signal to a gate of the first transistor when the control signal has a first logic level.

In some example embodiments, the second transistor may further have a drain coupled to a gate of the first transistor, and a gate, and the buffer may further include a third transistor having a source coupled to a third power supply line, a drain coupled to the gate of the first transistor, and a gate, a fourth transistor having a source coupled to the second power supply line, a drain coupled to the gate of the second transistor and the gate of the third transistor, and a gate receiving the control signal, and a fifth transistor having a source coupled to the third power supply line, a drain coupled to the gate of the second transistor and the gate of the third transistor, and a gate receiving the control signal.

According to other example embodiments, an integrated circuit includes a circuit block coupled to a virtual power supply line, a power management unit configured to generate a control signal, and a power gating circuit configured to selectively couple a first power supply line to the virtual power line in response to the control signal. The power gating circuit includes a first transistor coupled between the first power supply line and the virtual power supply line, the first transistor having a body coupled to the first power supply line, and a buffer configured to buffer the control signal to apply the buffered control signal to the first transistor, the buffer including a second transistor having a source coupled to a second power supply line and a body coupled to the first power supply line.

In some example embodiments, a first high power supply voltage may be applied to the first power supply line, and a second high power supply voltage which is greater than the first high power supply voltage may be applied to the second power supply line. The buffer may apply the second high power supply voltage as the buffered control signal to a gate of the first transistor when the control signal has a first logic level.

In some example embodiments, a first low power supply voltage may be applied to the first power supply line, and a second low power supply voltage which is less than the first low power supply voltage may be applied to the second power supply line. The buffer may apply the second low power supply voltage as the buffered control signal to a gate of the first transistor when the control signal has a first logic level.

In some example embodiments, a voltage level of at least one of a first power supply voltage applied to the first power supply line and a second power supply voltage applied to the second power supply line may be adjusted when testing the integrated circuit such that a sum of a leakage current of the first transistor and a leakage current of the buffer is reduced.

In some example embodiments, the integrated circuit may further include a nonvolatile memory configured to store the adjusted voltage level. The power supply voltages having the adjusted voltage level stored in the nonvolatile memory may be applied to the first and second power supply lines when operating the integrated circuit.

In some example embodiments, the integrated circuit may further include a monitoring unit configured to measure a leakage current of the first transistor and a leakage current of the buffer. The power management unit may be configured to adjust a voltage level of at least one of a first power supply voltage applied to the first power supply line and a second power supply voltage applied to the second power supply line such that a sum of the leakage current of the first transistor and the leakage current of the buffer measured by the monitoring unit is reduced.

According to still other example embodiments, an integrated circuit includes a circuit block and a power gating circuit. The circuit block is coupled between a virtual power supply line and a third power supply line. The power gating circuit comprises: a first transistor having: a first terminal coupled to a first power supply line, a second terminal coupled to the virtual power supply line, a gate, and a body coupled to the first power supply line; and a buffer configured to buffer a control signal to apply the buffered control signal to the gate of the first transistor, the buffer including a second transistor having a source coupled to a second power supply line and a body coupled to the first power supply line.

In some example embodiments, a first high power supply voltage is applied to the first power supply line, a second high power supply voltage which is greater than the first high power supply voltage is applied to the second power supply line, and a low power supply voltage which is less than the first high power supply voltage is applied to the third power supply line.

In some example embodiments, a first low power supply voltage is applied to the first power supply line, a second low power supply voltage which is less than the first low power supply voltage is applied to the second power supply line, and a high power supply voltage which is greater than the first low power supply voltage is applied to the third power supply line.

In some example embodiments, the integrated circuit further comprises: a power management unit configured to supply the control signal to the buffer; and a memory device configured to store therein information identifying a voltage difference between a first voltage to be applied to the a first power supply line and a second voltage to be applied to the second power supply line so as to minimize a total leakage current of the first transistor and the buffer in a sleep mode for the circuit block.

In some example embodiments, the integrated circuit further comprises: a power management unit and a monitoring unit. The power management unit is configured to supply the control signal to the buffer. The monitoring unit includes: a first leakage measuring unit configured to measure a leakage current of the first transistor when the circuit block is in a sleep mode, and a second leakage measuring unit configured to measure a leakage current of the buffer when the circuit block is in the sleep mode.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Figure 1:
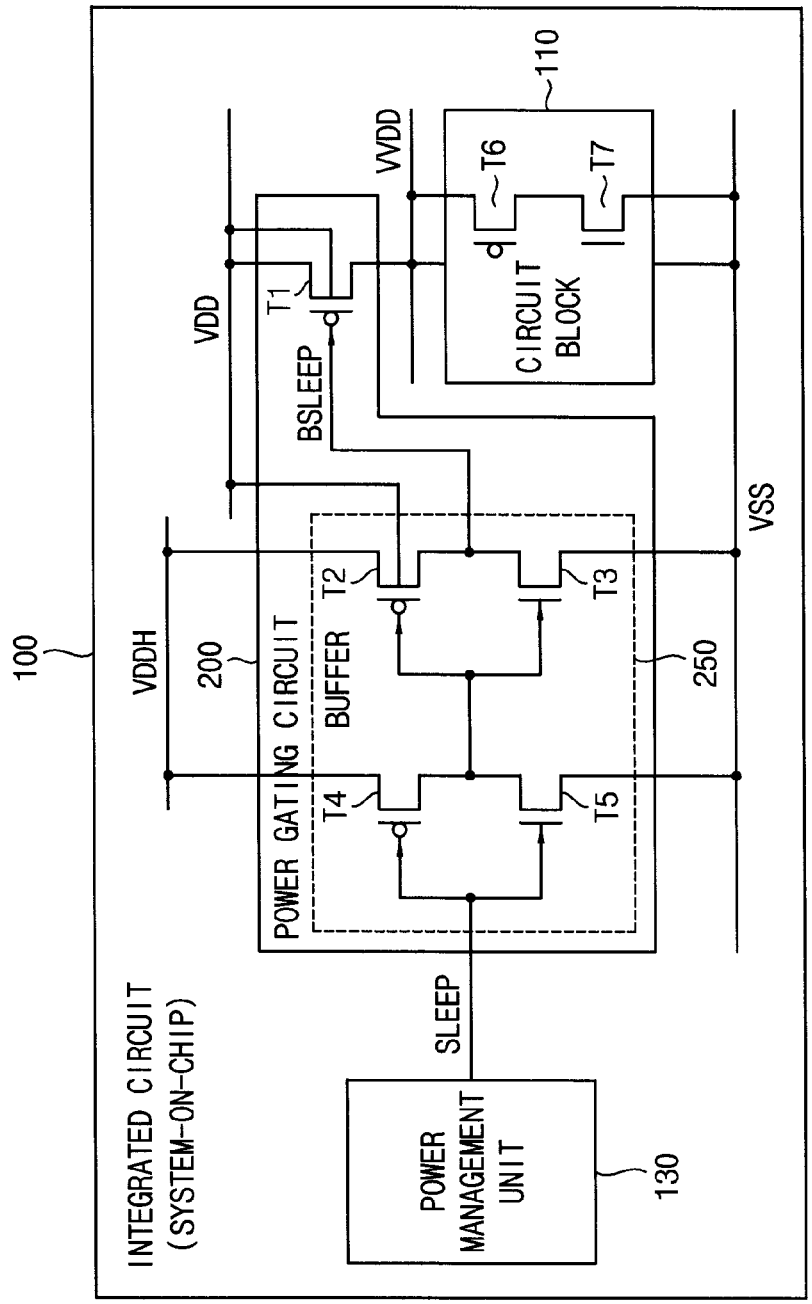
FIG. 1 is a diagram illustrating an integrated circuit including a power gating circuit according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating an integrated circuit 100 including a power gating circuit according to example embodiments.

Referring to FIG. 1, integrated circuit 100 includes a circuit block 110 coupled to a virtual power supply line VVDD, a power management unit 130 that generates a control signal SLEEP, and a power gating circuit 200 that allows circuit block 110 to be selectively supplied with power in response to the control signal SLEEP. In some example embodiments, integrated circuit 100 may be a system-on-chip (SOC). For example, integrated circuit 100 may be a mobile SOC, an application processor, a media processor, a microprocessor, a central processing unit (CPU), or the like.

Circuit block 110 may be selectively supplied with power through the virtual power supply line VVDD. That is, circuit block 110 may be supplied with power while a first power supply line VDD is coupled to the virtual power supply line VVDD, and may not be supplied with power while the first power supply line VDD is not coupled to the virtual power supply line VVDD. Circuit block 110 may include any circuit coupled to the virtual power supply line VVDD. In some example embodiments, circuit block 110 may include standard cells formed by a complementary metal-oxide semiconductor (CMOS) standard cell process. For example, the standard cells may be implemented as various types of circuits, such as an inverter, a NAND gate, an AND gate, a NOR gate, an OR gate, an XOR gate, an XNOR gate, a multiplexer, an adder, a latch, a flip-flop, or the like.

For example, circuit block 110 may include a PMOS transistor T6 coupled to the virtual power supply line VVDD and an NMOS transistor T7 coupled to a third power supply line VSS. While the first power supply line VDD is coupled to the virtual power supply line VVDD, a current path including the first power supply line VDD, the virtual power supply line VVDD, the PMOS transistor T6, the NMOS transistor T7 and the third power supply line VSS is formed, and the PMOS and NMOS transistors T6 and T7 of circuit block 110 may be supplied with power through the current path. Further, while the first power supply line VDD is not coupled to the virtual power supply line VVDD, the current path is not formed, and the PMOS and NMOS transistors T6 and T7 of circuit block 110 may not be supplied with power.

Power management unit 130 may apply the control signal SLEEP to power gating circuit 200 to cause power gating circuit 200 to selectively supply power to the circuit block 110 according to an operation mode. In some example embodiments, power management unit 130 may apply, as the control signal SLEEP, a sleep signal indicating a sleep mode to power gating circuit 200, and in response thereto power gating circuit 200 may decouple the first power supply line VDD from the virtual power supply line VVDD.

Power gating circuit 200 may selectively couple the first power supply line VDD to the virtual power supply line VVDD in response to the control signal SLEEP from power management unit 130 such that circuit block 110 is selectively supplied with power. Power gating circuit 200 may include a first transistor T1 coupled between the first power supply line VDD and the virtual power supply line VVDD, and a buffer 250 that buffers the control signal SLEEP from power management unit 130 to apply the buffered control signal BSLEEP to the first transistor T1.

The first transistor T1 may selectively couple the first power supply line VDD to the virtual power supply line VVDD in response to the buffered control signal BSLEEP such that circuit block 110 is selectively supplied with power. Thus, the first transistor T1 may be referred to as a power cut-off switch. Although FIG. 1 illustrates an example where one power cut-off switch T1 is coupled between the first power supply line VDD and the virtual power supply line VVDD, in some example embodiments, a plurality of power cut-off switches may be disposed between the first power supply line VDD and the virtual power supply line VVDD.

The first transistor T1 may include a body coupled to the first power supply line VDD. The first transistor T1 may further include a source coupled to the first power supply line VDD, a drain coupled to the virtual power supply line VVDD, and a gate receiving the buffered control signal BSLEEP from buffer 250. When the control signal SLEEP from power management unit 130 has a first logic level (e.g., a logic high level) indicating the sleep mode, the buffered sleep signal BSLEEP applied to the gate of the first transistor T1 may be a power supply voltage applied to a second power supply line VDDH that has a voltage level different from a voltage level of a power supply voltage applied to the first power supply line VDD. In some example embodiments, a first high power supply voltage is applied to the first power supply line VDD, a second high power supply voltage which is greater than the first high power supply voltage, is applied to the second power supply line VDDH, and the buffered sleep signal BSLEEP applied to the gate of the first transistor T1 may be same or essentially the same as the second high power supply voltage.

In a conventional power gating circuit, a voltage having the same voltage level as a power supply voltage applied to a source of a power cut-off switch is applied to a gate of the power cut-off switch. In this case, although the power cut-off switch is turned off to electrically decouple a power supply line from a virtual power supply line, a leakage current (e.g., a sub-threshold leakage) through the power cut-off switch may occur. However, in power gating circuit 200 according to example embodiments, the second high power supply voltage, which is greater than the first high power supply voltage applied to the source of the power cut-off switch T1, is applied to the gate of the power cut-off switch T1, and thus the leakage current of the power cut-off switch T1 may be reduced or prevented.

Buffer 250 may receive the control signal SLEEP from power management unit 130, and may apply the buffered control signal BSLEEP to the gate of the first transistor T1. Buffer 250 may be coupled between the second power supply line VDDH to which the second high power supply voltage, which is greater than the first high power supply voltage, is applied and the third power supply line VSS. Accordingly, when the control signal SLEEP from power management unit 130 has the first logic level indicating the sleep mode, buffer 250 may apply the second high power supply voltage as the buffered control signal BSLEEP to the gate of the first transistor T1, thereby reducing the leakage current of the first transistor T1 and reducing the power consumption in the sleep mode. Further, since buffer 250 is coupled to the second power supply line VDDH to which the second high power supply voltage is applied such that power gating circuit 200 applies the second high power supply voltage having the relatively high voltage level to the gate of the first transistor T1 without a level shifter, power gating circuit 200 may have a small size compared with a power gating circuit including a level shifter, and integrated circuit 100 may have a small size.

To apply the second high power supply voltage of the second power supply line VDDH as the buffered control signal BSLEEP to the gate of the first transistor T1, buffer 250 may include a second transistor T2 having a source coupled to the second power supply line VDDH and a drain coupled to the gate of the first transistor T1. The second transistor T2, when turned ON, may couple the second power supply line VDDH to the gate of the first transistor T1. The body of the second transistor T2 may be coupled to the first power supply line VDD. Accordingly, the second transistor T2 may be formed at a substrate region or a well where the first transistor T1 is formed. If the body of the second transistor T2 is coupled to the second power supply line VDDH to which the source of the second transistor T2 is coupled, a well where the first transistor T1 is formed and a well where the second transistor T2 is formed may be separated from each other. For this well separation, the second transistor T2 should be formed in an additional voltage area, and thus the size of power gating circuit 200 and the size of integrated circuit 100 may be increased. However, in power gating circuit 200 according to example embodiments, although the source of the second transistor T2 is coupled to the second power supply line VDDH, the body of the second transistor may be coupled to the first power supply line VDD, and thus first and second transistors T1 and T2 may be formed at the same well. Accordingly, the size of power gating circuit 200 according to example embodiments may be reduced, and therefore the size of integrated circuit 100 including power gating circuit 200 also may be reduced.

In some example embodiments, buffer 250 may include at least one inverter. For example, buffer 250 may include a first inverter comprising second and third transistors T2 and T3, and a second inverter comprising fourth and fifth transistors T4 and T5. The first inverter include: the second transistor T2 having the source coupled to the second power supply line VDDH, a drain coupled to the gate of the first transistor T1, and a gate; and the third transistor T3 having a source coupled to the third power supply line VSS, a drain coupled to the gate of the first transistor T1, and a gate. The second inverter may include: the fourth transistor T4 having a source coupled to the second power supply line VDDH (or the first power supply line VDD), a drain coupled to the gate of the second transistor T2 and the gate of the third transistor T3, and a gate receiving the control signal SLEEP; and a fifth transistor T5 having a source coupled to the third power supply line VSS, a drain coupled to the gate of the second transistor T2 and the gate of the third transistor T3, and a gate receiving the control signal SLEEP. Although FIG. 1 illustrates an example where buffer 250 has two inverters, according to example embodiments, buffer 250 may include any number of inverters.

In some example embodiments, the body of the fourth transistor T4 may be coupled to the first power supply line VDD, and the fourth transistor T4 may be formed at the substrate region or the well where the first transistor T1 is formed. Further, a body of the PMOS transistor T6 included in circuit block 110 may be coupled to the first power supply line VDD, and the PMOS transistor T6 may be formed at the substrate region or the well where the first transistor T1 is formed. For example, at least some or all of PMOS transistors T1, T2, T4 and T6 included in integrated circuit 100 may be formed at the same well. Accordingly, integrated circuit 100 may have the small size. Bodies of NMOS transistors T3, T5 and T7 included in the integrated circuit 100 may be coupled to the third power supply line VSS, and at least some or all of NMOS transistors T3, T5 and T7 included in integrated circuit 100 may be formed at the same substrate region or the same well.

As the second high power supply voltage applied to the second power supply line VDDH increases compared with the first high power supply voltage applied to the first power supply line VDD, the leakage current through the first transistor T1 (or the power cut-off switch T1) in the sleep mode may be reduced. However, since a body voltage (or the first high power supply voltage) of the PMOS transistors T2 and T4 included in buffer 250 is decreased compared with a source voltage (or the second high power supply voltage) of the PMOS transistors T2 and T4 as the second high power supply voltage increases compared with the first high power supply voltage, a forward body biasing condition may be formed at the PMOS transistors T2 and T4, and a leakage current may occur at buffer 250. This leakage current of buffer 250 may be increased as the second high power supply voltage increases compared with the first high power supply voltage. Accordingly, to minimize a leakage current of integrated circuit 100 in the sleep mode, a gate-source voltage (Vgs) of the first transistor T1, or a voltage difference between the first high power supply voltage applied to the first power supply line VDD and the second high power supply voltage applied to the second power supply line VDDH may be determined based on the leakage current of the first transistor T1 and the leakage current of the buffer 250 such that a sum of the leakage current of the first transistor T1 and the leakage current of the buffer 250 is minimized.

As described above, power gating circuit 200 according to example embodiments couples the second power supply line VDDH to the gate of the power cut-off switch T1 having the source coupled to the first power supply line VDD, thereby reducing the power consumption in the sleep mode. Further, since power gating circuit 200 according to example embodiments applies the second high power supply voltage to the gate of the power cut-off switch T1 without a level shifter by using buffer 250 coupled to the second power supply line VDDH, the size of power gating circuit 200 and the size of integrated circuit 100 including power gating circuit 200 may be reduced. In addition, in power gating circuit 200 according to example embodiments, although the source of the PMOS transistor T2 included in buffer 250 is coupled to the second power supply line VDDH, the body of the PMOS transistor T2 included in buffer 250 may be coupled to the first power supply line VDD, and thus the PMOS transistor T2 included in buffer 250 may be formed at the same substrate region or the same well as the power cut-off switch T1 and/or the PMOS transistor T6 included in circuit block 110. Accordingly, the size of power gating circuit 200 according to example embodiments may be further reduced, and the size of integrated circuit 100 including power gating circuit 200 may be further reduced.

Figure 2:
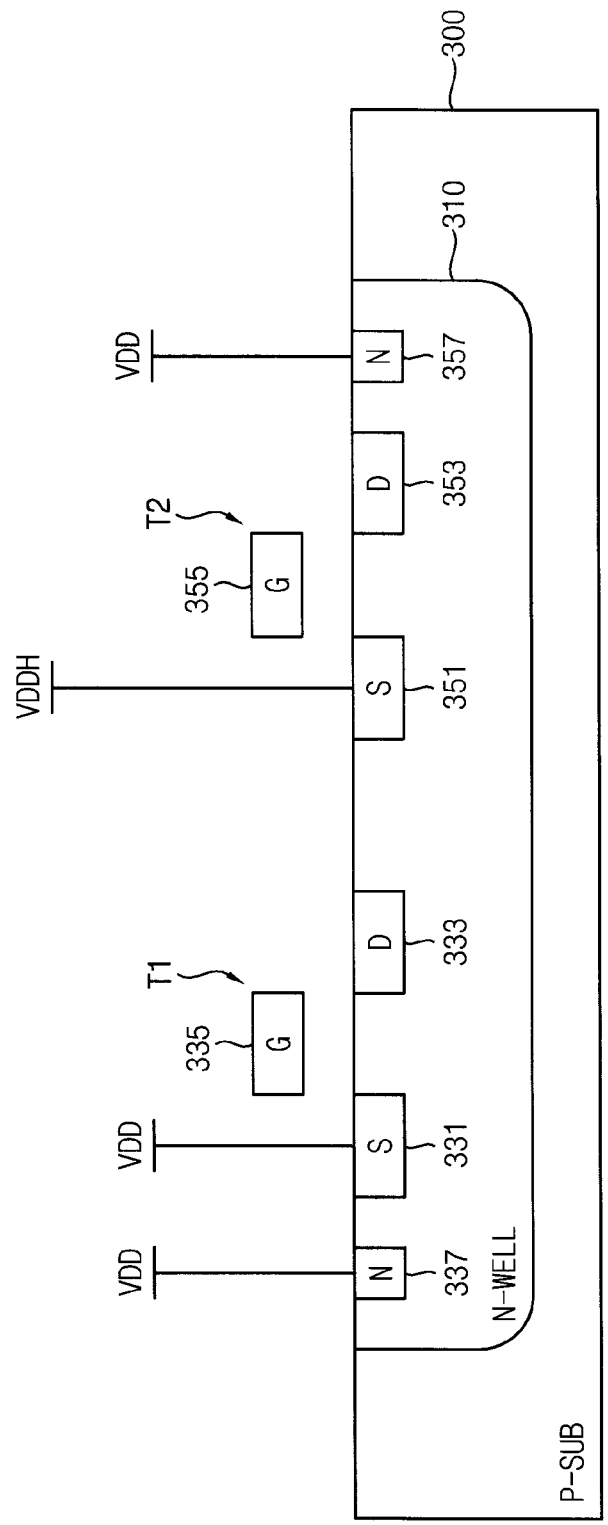
FIG. 2 is a cross sectional diagram illustrating examples of first and second transistors illustrated in FIG. 1.

FIG. 2 is a cross sectional diagram illustrating examples of first and second transistors illustrated in FIG. 1.

Referring to FIG. 2, a first transistor T1 operating as a power cut-off switch includes a source 331, a drain 333 and a gate 335, and a second transistor T2 included in a buffer includes a source 351, a drain 353 and a gate 355.

Source 331 of the first transistor T1 may be coupled to a first power supply line VDD, and the body of the first transistor T1 may be coupled to the first power supply line VDD through a contact region 337. Source 351 of the second transistor T2 may be coupled to a second power supply line VDDH to which a second high power supply voltage higher than a first high power supply voltage of the first power supply line VDD is applied. Although source 351 of the second transistor T2 is coupled to the second power supply line VDDH, the body of the second transistor T2 may be coupled to the first power supply line VDD through a contact region 357. Since the bodies of the first and second transistors T1 and T2 are coupled to the same power supply line VDD, a well separation for the first and second transistors T1 and T2 is not required, and the first and second transistors T1 and T2 may be formed at the same substrate region or the same well 310. For example, the first and second transistors T1 and T2 may be formed at the same N-type well 310 in a P-type substrate 300. Accordingly, the size of power gating circuit 200 including the first and second transistor T1 and T2 may be reduced, and therefore the size of integrated circuit 100 including the power gating circuit also may be reduced.

Figure 3:
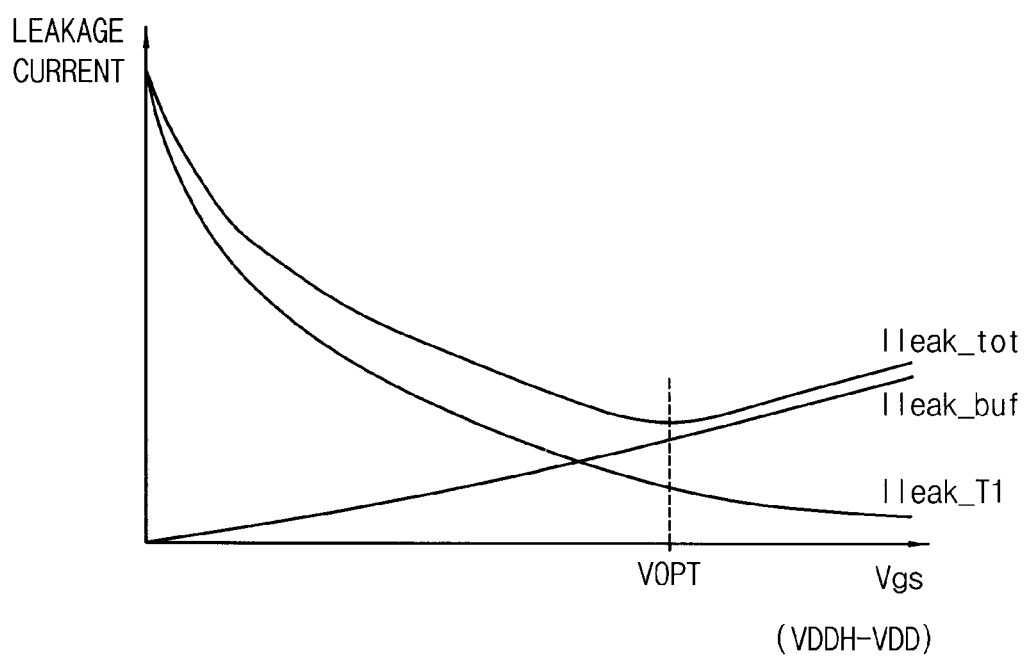
FIG. 3 is a graph illustrating a leakage current according to a gate-source voltage of a power cut-off switch.

FIG. 3 is a graph illustrating a leakage current according to a gate-source voltage of a power cut-off switch.

Referring to FIGS. 1 and 3, as a gate-source voltage Vgs of a power cut-off switch T1 increases, or as a second high power supply voltage applied to a second power supply line VDDH increases compared with a first high power supply voltage applied to a first power supply line VDD, a leakage current Ileak_T1 of the power cut-off switch T1 may be decreased.

However, since a body voltage (or the first high power supply voltage) of PMOS transistors T2 and T4 included in buffer 250 is decreased compared with a source voltage (or the second high power supply voltage) of the PMOS transistors T2 and T4 as the second high power supply voltage increases compared with the first high power supply voltage, a forward body biasing condition may be formed at the PMOS transistors T2 and T4, and a leakage current Ileak_buf may occur at buffer 250. This leakage current Ileak_buf of buffer 250 may be increased as the gate-source voltage Vgs of the power cut-off switch T1 increases, or as the second high power supply voltage increases compared with the first high power supply voltage.

A leakage current Ileak_tot of an integrated circuit 100 in a sleep mode may correspond to a sum of the leakage current Ileak_T1 of the power cut-off switch T1 and the leakage current Ileak_buf of buffer 250. Accordingly, to minimize the leakage current Ileak_tot of integrated circuit 100 in the sleep mode, the gate-source voltage (Vgs) of the first transistor T1, or a voltage difference between the first high power supply voltage applied to the first power supply line VDD and the second high power supply voltage applied to the second power supply line VDDH may be determined as an optimal voltage VOPT for minimizing the sum of the leakage current Ileak_T1 of the power cut-off switch T1 and the leakage current Ileak_buf of buffer 250.

To adjust the voltage difference between the first and second high power supply voltages to the optimal voltage VOPT, at least one of the first high power supply voltage and the second high power supply voltage may be adjusted. In some example embodiments, adjusting or determining the power supply voltage may be performed when manufacturing or testing integrated circuit 100. In other example embodiments, adjusting or determining the power supply voltage may be performed when integrated circuit 100 performs a normal operation.

Figure 4:
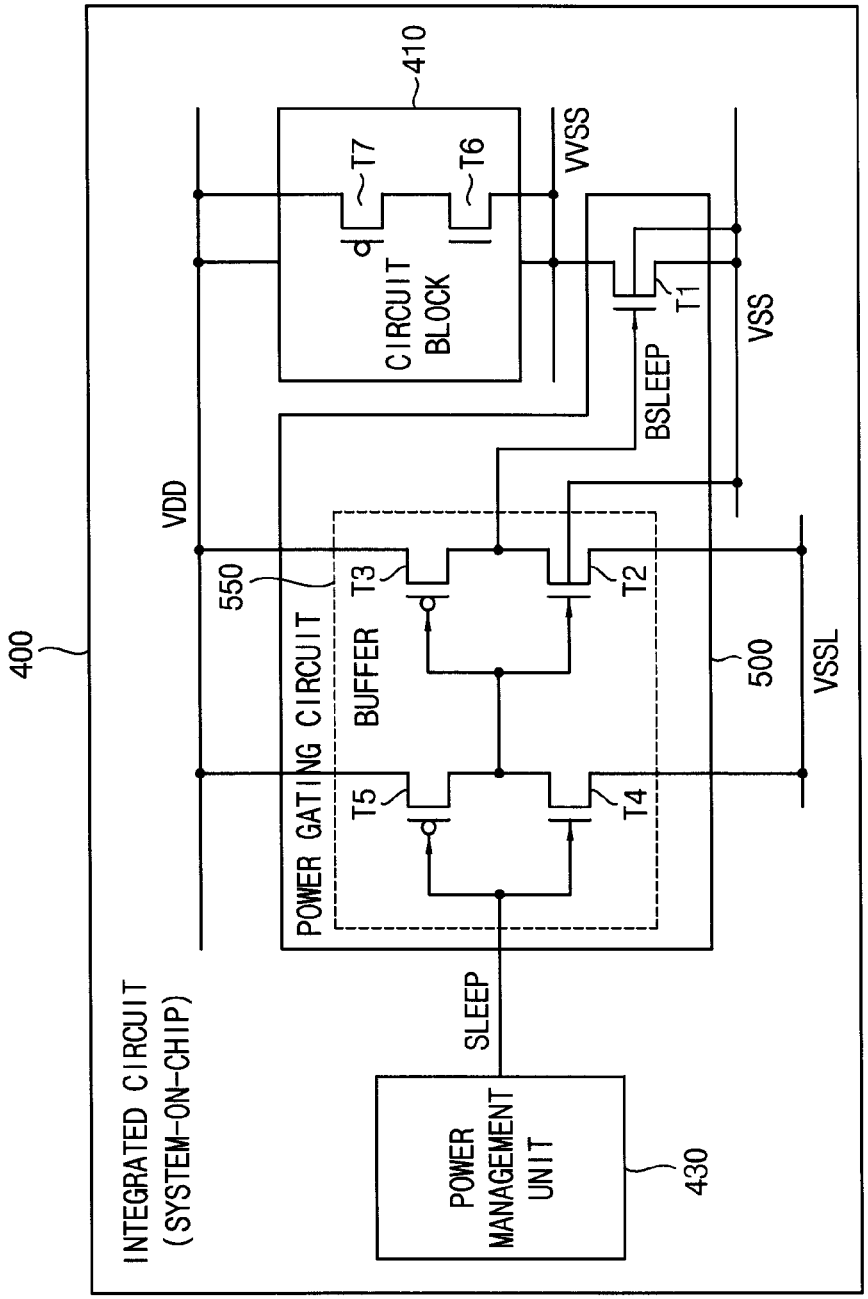
FIG. 4 is a diagram illustrating an integrated circuit including a power gating circuit according to example embodiments.
Figure 5:
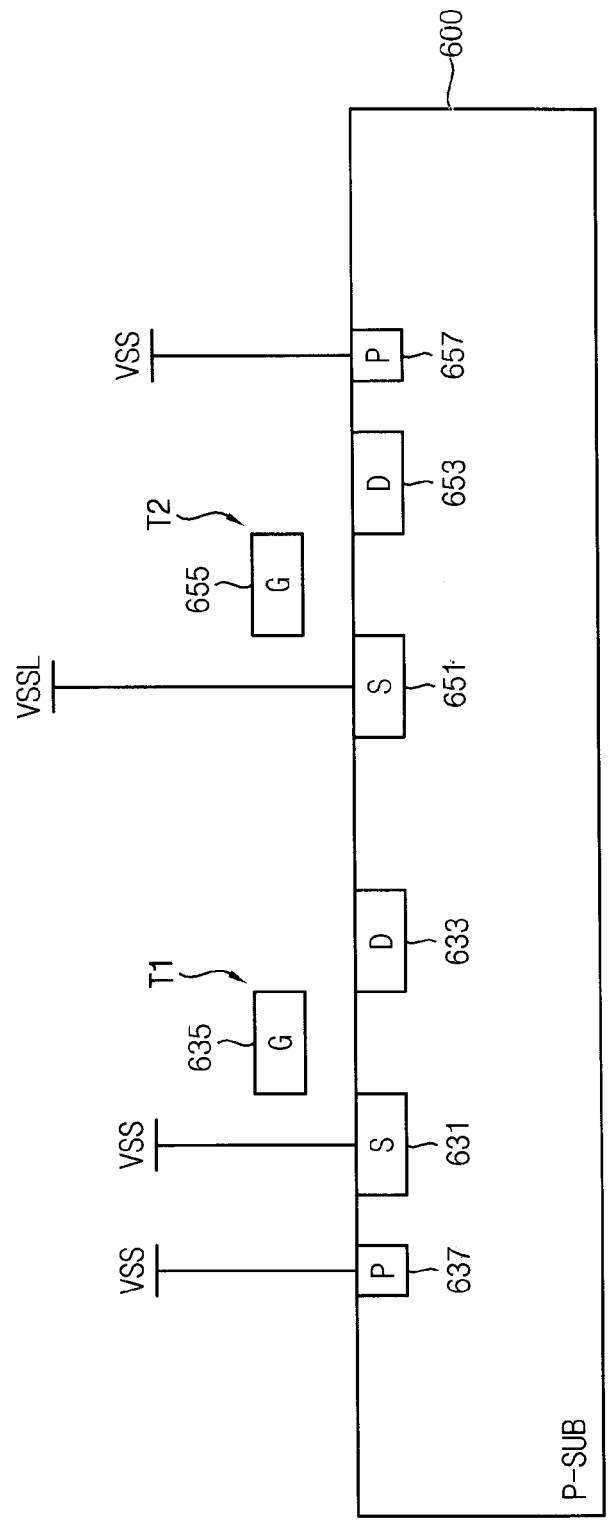
FIG. 5 is a cross sectional diagram illustrating examples of first and second transistors illustrated in FIG. 4.
Figure 6:
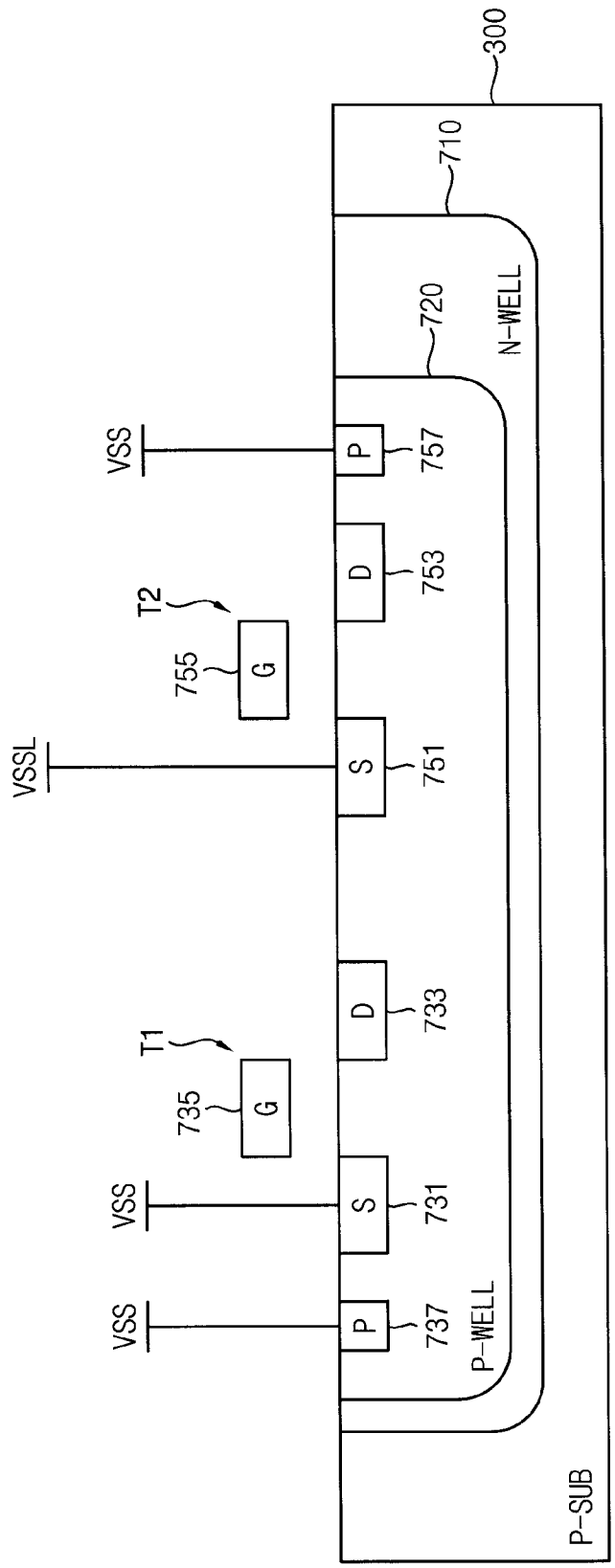
FIG. 6 is a cross sectional diagram illustrating other examples of first and second transistors illustrated in FIG. 4.

FIG. 4 is a diagram illustrating an integrated circuit 400 including a power gating circuit according to example embodiments, FIG. 5 is a cross sectional diagram illustrating examples of first and second transistors illustrated in FIG. 4, and FIG. 6 is a cross sectional diagram illustrating other examples of first and second transistors illustrated in FIG. 4.

Referring to FIG. 4, integrated circuit 400 includes a circuit block 410 coupled to a virtual power supply line VVSS, a power management unit 430 that generates a control signal SLEEP, and a power gating circuit 500 that allows circuit block 410 to be selectively supplied with power in response to the control signal SLEEP. Unlike power gating circuit 200 of FIG. 1 including a "header type" power cut-off switch, power gating circuit 500 of FIG. 4 may include a "footer type" power cut-off switch T1.

Circuit block 410 may be selectively supplied with power through the virtual power supply line VVSS. Circuit block 410 may include any circuit coupled to the virtual power supply line VVSS. In some example embodiments, circuit block 410 may include standard cells. For example, circuit block 410 may include an NMOS transistor T6 coupled to the virtual power supply line VVSS and a PMOS transistor T7 coupled to a third power supply line VDD. While the first power supply line VSS is coupled to the virtual power supply line VVSS, a current path including the third power supply line VDD, the PMOS transistor T7, the NMOS transistor T6, the virtual power supply line VVSS, and the first power supply line VSS is formed, and the NMOS and PMOS transistors T6 and T7 of circuit block 410 may be supplied with power through the current path.

Power management unit 430 may apply the control signal SLEEP to power gating circuit 500 to cause power gating circuit 500 to selectively supply power to the circuit block 410 according to an operation mode. In some example embodiments, power management unit 430 may apply, as the control signal SLEEP, a sleep signal indicating a sleep mode to power gating circuit 500, and power gating circuit 500 may decouple the first power supply line VSS from the virtual power supply line VVSS in response to the sleep signal.

Power gating circuit 500 may selectively couple the first power supply line VSS to the virtual power supply line VVSS in response to the control signal SLEEP from power management unit 430 such that circuit block 410 is selectively supplied with power. Power gating circuit 500 may include a first transistor T1 coupled between the first power supply line VSS and the virtual power supply line VVSS, and a buffer 550 that buffers the control signal SLEEP from power management unit 430 to apply the buffered control signal BSLEEP to the first transistor T1.

The body of the first transistor T1 may be coupled to the first power supply line VSS. When the control signal SLEEP from power management unit 430 has a first logic level indicating the sleep mode, a power supply voltage of a second power supply line VSSL may be applied as the buffered sleep signal BSLEEP to the gate of the first transistor T1. In some example embodiments, a first low power supply voltage (e.g., a ground voltage) may be applied to the first power supply line VSS, and a second low power supply voltage (e.g., a negative voltage), which is less than the first low power supply voltage, may be applied to the second power supply line VSSL. Accordingly, a leakage current of the first transistor T1 (or the power cut-off transistor T1) may be reduced.

Buffer 550 may be coupled to the second power supply line VSSL, and thus the second low power supply voltage having the low voltage level may be applied to the gate of the first transistor T1 without a level shifter. Accordingly, the size of power gating circuit 500 may be reduced, and therefore the size of integrated circuit 400 also may be reduced.

To apply the second low power supply voltage of the second power supply line VSSL as the buffered control signal BSLEEP to the gate of the first transistor T1, buffer 550 may include a second transistor T2 having a source coupled to the second power supply line VSSL and a drain coupled to the gate of the first transistor T1. The body of the second transistor T2 may be coupled to the first power supply line VSS. Accordingly, the second transistor T2 may be formed at a substrate region or a well where the first transistor T1 is formed.

For example, as illustrated in FIG. 5, the first transistor T1 operating as the power cut-off switch may include a source 631, a drain 633 and a gate 635, and the second transistor T2 included in buffer 550 may include a source 651, a drain 653 and a gate 655. Source 631 of the first transistor T1 may be coupled to the first power supply line VSS, and the body of the first transistor T1 may be coupled to the first power supply line VSS through a contact region 637. Source 651 of the second transistor T2 may be coupled to the second power supply line VSSL to which the second low power supply voltage which is less than the first low power supply voltage of the first power supply line VSS is applied. Although source 651 of the second transistor T2 is coupled to the second power supply line VSSL, the body of the second transistor T2 may be coupled to the first power supply line VSS through a contact region 657. Since the bodies of the first and second transistors T1 and T2 are coupled to the same power supply line VSS, a well separation for the first and second transistors T1 and T2 is not required, and the first and second transistors T1 and T2 may be formed at the same region of a substrate 600. Accordingly, the size of power gating circuit 500 including the first and second transistors T1 and T2 may be reduced, and therefore the size of integrated circuit 400 including the power gating circuit also may be reduced.

In another example, as illustrated in FIG. 6, the first transistor T1 operating as the power cut-off switch may include a source 731, a drain 733 and a gate 735, and the second transistor T2 included in the buffer 550 may include a source 751, a drain 753 and a gate 755. The body of the first transistor T1 may be coupled to the first power supply line VSS through a contact region 737. Although source 751 of the second transistor T2 is coupled to the second power supply line VSSL, the body of the second transistor T2 may be coupled to the first power supply line VSS through a contact region 757. Since the bodies of the first and second transistors T1 and T2 are coupled to the same power supply line VSS, the first and second transistors T1 and T2 may be formed at the same well 720. For example, an N-type well 710 may be formed in a P-type substrate 700, and PMOS transistors may be formed at N-type well 710. Further, P-type well 720 may be formed in N-type well 710, and the first and second transistors T1 and T2 may be formed at the same P-type well 720. Accordingly, the size of power gating circuit 500 including the first and second transistors T1 and T2 may be reduced, and the size of integrated circuit 400 including the power gating circuit may be reduced.

In some example embodiments, buffer 550 may include at least one inverter. For example, buffer 550 may include: a first inverter including the second transistor T2 and a third transistor T3; and a second inverter including a fourth transistor T4 and a fifth transistor T5. At least some or all of NMOS transistors T1, T2, T4 and T6 included in integrated circuit 400 may be coupled to the first power supply line VSS, and the NMOS transistors T1, T2, T4 and T6 may be formed at the same substrate region or the same well. Accordingly, integrated circuit 400 may have a small size. Bodies of PMOS transistors T3, T5 and T7 included in integrated circuit 400 may be coupled to the third power supply line VDD, and at least some or all of PMOS transistors T3, T5 and T7 included in integrated circuit 400 may be formed at the same substrate region or the same well.

As described above, power gating circuit 500 according to example embodiments couples the second power supply line VSSL to the gate of the power cut-off switch T1 having the source coupled to the first power supply line VSS, thereby reducing the power consumption in the sleep mode. Further, since power gating circuit 500 according to example embodiments applies the second low power supply voltage to the gate of the power cut-off switch T1 without a level shifter by using the buffer 550 coupled to the second power supply line VSSL, the size of power gating circuit 500 and the size of integrated circuit 400 including power gating circuit 500 may be reduced. In addition, in power gating circuit 500 according to example embodiments, although the source of the NMOS transistor T2 included in buffer 550 is coupled to the second power supply line VSSL, the body of the NMOS transistor T2 included in the buffer 550 may be coupled to the first power supply line VSS, and thus the NMOS transistor T2 included in the buffer 550 may be formed at the same substrate region or the same well as the power cut-off switch T1 and/or the NMOS transistor T6 included in circuit block 410. Accordingly, the size of power gating circuit 500 according to example embodiments may be further reduced, and therefore the size of integrated circuit 400 including power gating circuit 500 also may be further reduced.

Figure 7:
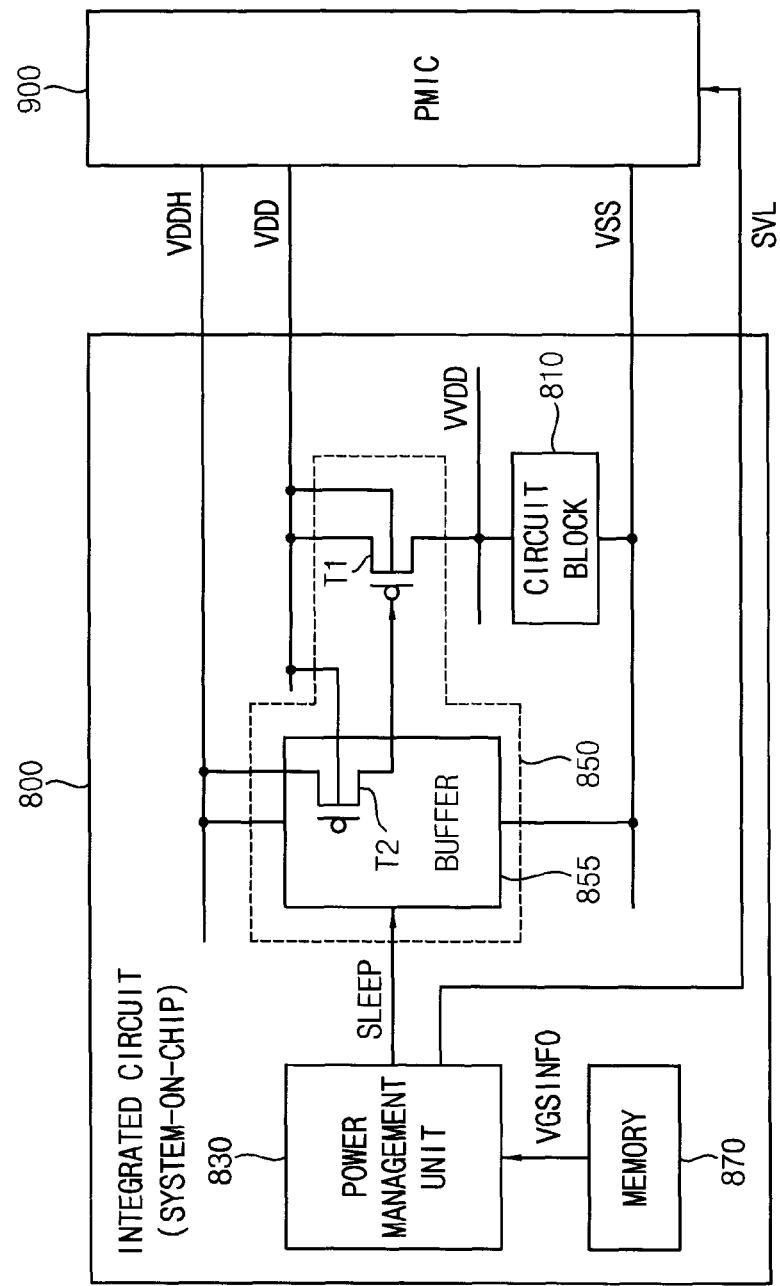
FIG. 7 is a diagram illustrating an integrated circuit according to example embodiments.

FIG. 7 is a diagram illustrating an integrated circuit 800 according to example embodiments.

Referring to FIG. 7, integrated circuit 800 includes a circuit block 810 coupled to a virtual power supply line VVDD, a power management unit 830 that generates a control signal SLEEP, a power gating circuit 850 that allows circuit block 810 to be selectively supplied with power in response to the control signal SLEEP, and a nonvolatile memory 870. In some example embodiments, integrated circuit 800 may be a system-on-chip (SOC). For example, integrated circuit 800 may be a mobile SOC, an application processor, a media processor, a microprocessor, a central processing unit (CPU), or the like.

In a sleep mode, as a gate-source voltage (Vgs) of a power cut-off switch T1, or a voltage difference between a first high power supply voltage applied to a first power supply line VDD and a second high power supply voltage applied to a second power supply line VDDH, increases, a leakage current of the power cut-off switch T1 may be reduced, but a leakage current of a buffer 855 may be increased since a forward body biasing condition is formed at a PMOS transistor T2 included in buffer 855. Accordingly, to reduce power consumption in the sleep mode, a voltage level of at least one of the first high power supply voltage applied to the first power supply line VDD and the second high power supply voltage applied to the second power supply line VDDH may be adjusted to minimize a sum of the leakage current of a power cut-off switch T1 and the leakage current of buffer 855.

In some example embodiments, adjusting the voltage level of the at least one of the first and second high power supply voltages may be performed during a test step for integrated circuit 800, and information VGSINFO for the adjusted voltage level may be stored in nonvolatile memory 870.

Power management unit 830 may provide a power management integrated circuit (PMIC) 900 with a voltage level signal SSL indicating the adjusted voltage level based on the information VGSINFO for the adjusted voltage level stored in nonvolatile memory 870. PMIC 900 may apply the first and second high power supply voltages having appropriate voltage levels to the first and second power supply line VDD and VDDH based on the voltage level signal SSL.

Figure 8:
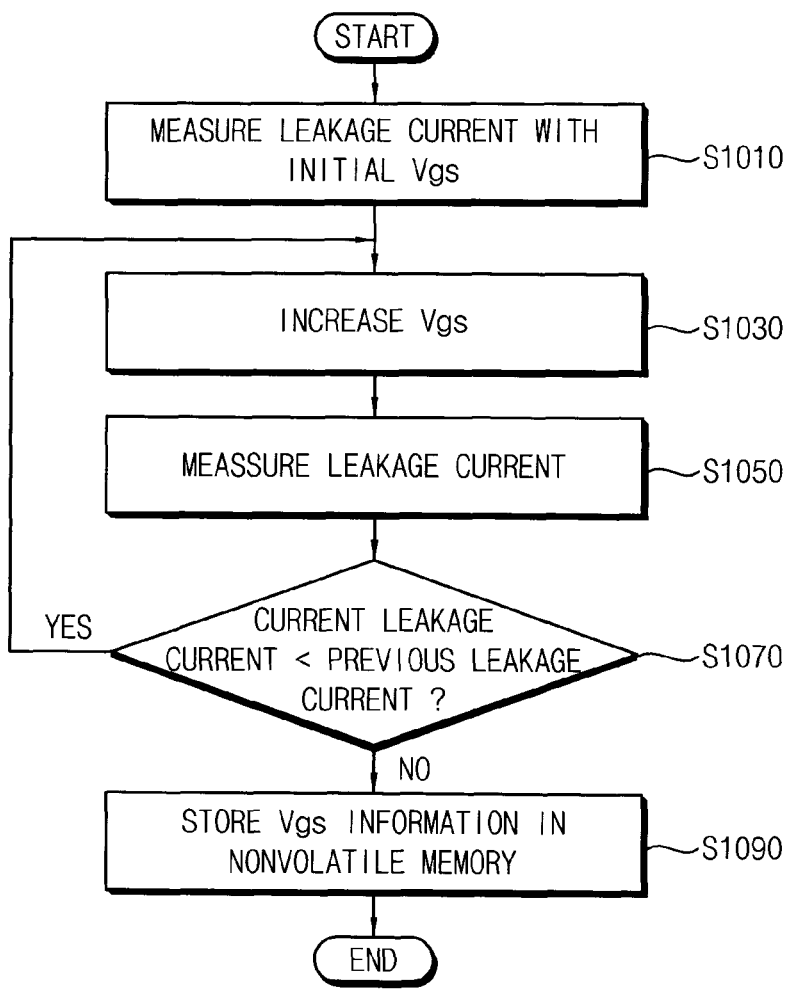
FIG. 8 is a flowchart illustrating an example of a method of determining a gate-source voltage of a power cut-off switch according to example embodiments.

FIG. 8 is a flowchart illustrating an example of a method of determining a gate-source voltage of a power cut-off switch according to example embodiments.

Referring to FIGS. 7 and 8, during a test step of a manufacturing process for an integrated circuit 800, PMIC 900 may provide first and second power supply lines VDD and VDDH with first and second high power supply voltages having a voltage difference corresponding to an initial (or default) gate-source voltage (Vgs) of a power cut-off switch T1, and a leakage current of integrated circuit 800 may be measured (S1010).

A voltage level of at least one of the first and second high power supply voltages may be adjusted to increase the gate-source voltage of the power cut-off switch T1 (S1030), and the leakage current of integrated circuit 800 may be measured again (S1050).

If a currently measured leakage current is less than a previously measured leakage current (S1070: YES), then the voltage level of the at least one of the first and second high power supply voltages may be adjusted again (S1030), and the leakage current of integrated circuit 800 may be measured again (S1050).

If the currently measured leakage current is greater than or equal to the previously measured leakage current (S1070: NO), the current gate-source voltage of the power cut-off switch T1 may be an optimal voltage that minimizes the leakage current of integrated circuit 800 in the sleep mode, and information VGSINFO for the current gate-source voltage, or voltage levels of the current first and second high power supply voltages, may be stored in nonvolatile memory 870 (S1090).

When integrated circuit 800 performs a normal operation, power management unit 830 may control PMIC 900 based on the information VGSINFO for the gate-source voltage, or the voltage levels of the first and second high power supply voltages, and thus the first and second high power supply voltages having appropriate voltage levels may be applied to the first and second power supply line VDD and VDDH.

Figure 9:
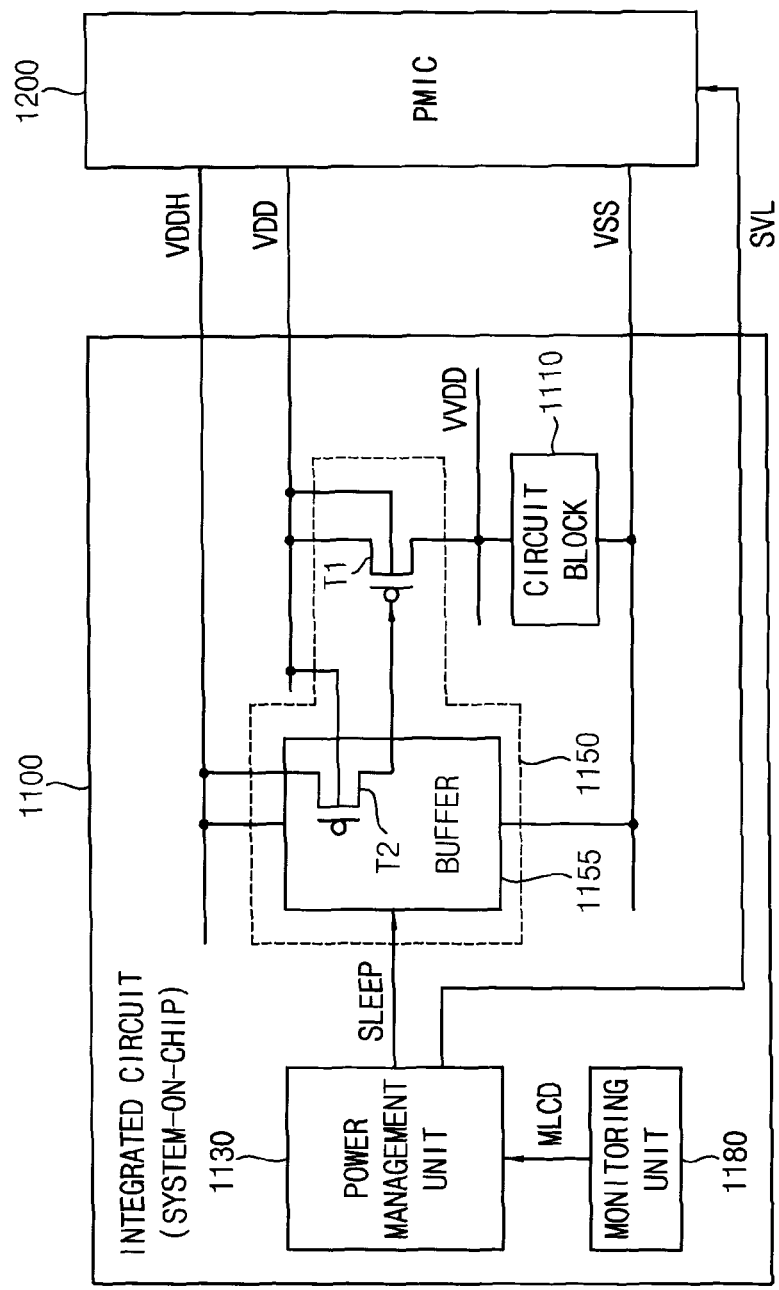
FIG. 9 is a diagram illustrating an integrated circuit according to example embodiments.
Figure 10:
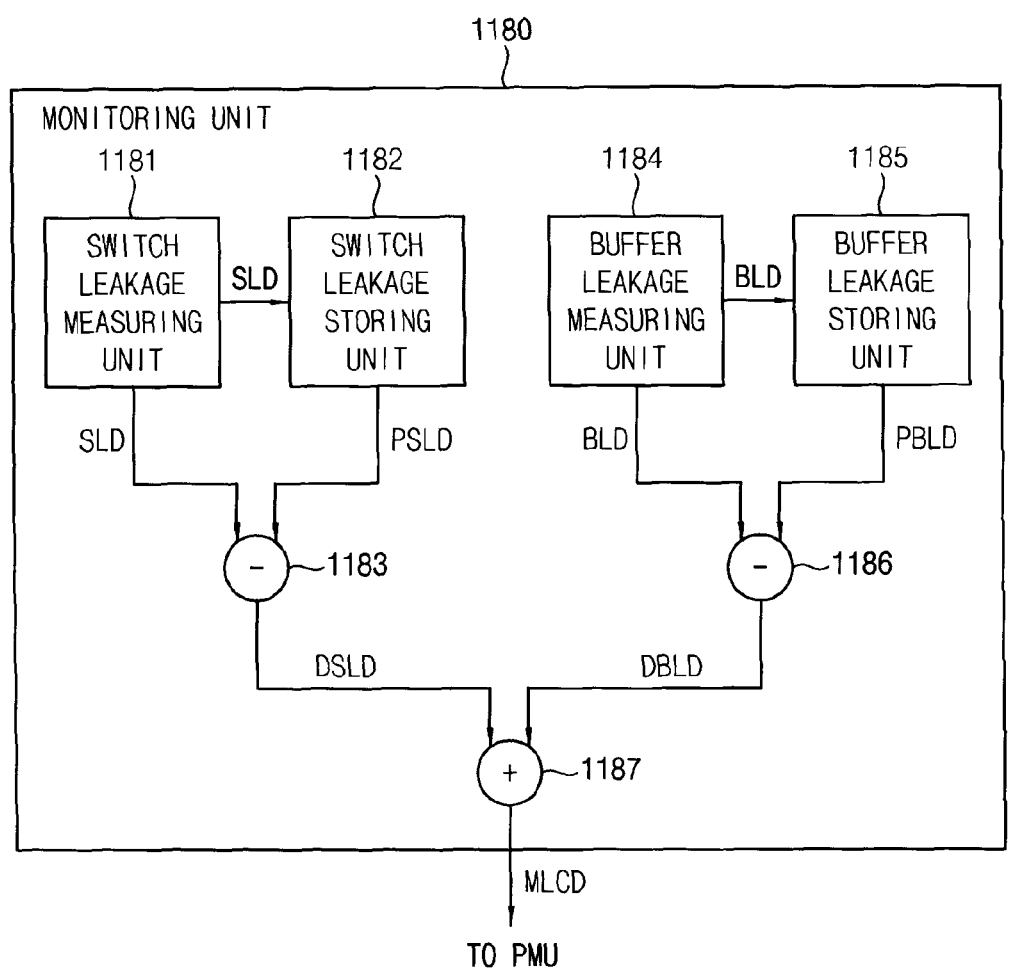
FIG. 10 is a cross sectional diagram illustrating an example of a monitoring unit illustrated in FIG. 9.

FIG. 9 is a diagram illustrating an integrated circuit 1100 according to example embodiments, and FIG. 10 is a cross sectional diagram illustrating an example of a monitoring unit illustrated in FIG. 9.

Referring to FIG. 9, integrated circuit 1100 includes a circuit block 1110 coupled to a virtual power supply line VVDD, a power management unit 1130 that generates a control signal SLEEP, a power gating circuit 1150 that allows circuit block 1110 to be selectively supplied with power in response to the control signal SLEEP, and a monitoring unit 1180.

Monitoring unit 1180 may measure a leakage current of a power cut-off switch T1 and a leakage current of a buffer 1155, and may provide power management unit 1130 with data MLCD for the measured leakage current. In some example embodiments, as illustrated in FIG. 10, monitoring unit 1180 may include a switch leakage measuring unit 1181, a switch leakage storing unit 1182, a first subtractor 1183, a buffer leakage measuring unit 1184, a buffer leakage storing unit 1185, a second subtractor 1186 and an adder 1187.

Switch leakage measuring unit 1181 may measure the leakage current of the power cut-off switch T1, and may store switch leakage data SLD for the leakage current of the power cut-off switch T1 in switch leakage storing unit 1182. First subtractor 1183 may receive current switch leakage data SLD from switch leakage measuring unit 1181, may receive previous (e.g., immediately previous) switch leakage data PSLD from switch leakage storing unit 1182, and may calculate a change amount of the leakage current of the power cut-off switch T1 by subtracting the previous switch leakage data PSLD from the current switch leakage data SLD.

Buffer leakage measuring unit 1184 may measure the leakage current of buffer 1155, and may store buffer leakage data BLD for the leakage current of buffer 1155 in the buffer leakage storing unit 1185. Second subtractor 1186 may receive current buffer leakage data BLD from buffer leakage measuring unit 1184, may receive previous (e.g., immediately previous) buffer leakage data PBLD from buffer leakage storing unit 1185, and may calculate a change amount of the leakage current of buffer 1155 by subtracting the previous buffer leakage data PBLD from the current buffer leakage data BLD.

Adder 1187 may add the change amount of the leakage current of the power cut-off switch T1 and the change amount of the leakage current of buffer 1155, and may provide power management unit 1130 with a result of the addition as data MLCD for the leakage current measured by monitoring unit 1180.

Power management unit 1130 may adjust a voltage level of at least one of a first high power supply voltage applied to a first power supply line VDD or a second high power supply voltage applied to a second power supply line VDDH based on the leakage current of the first transistor T1 and the leakage current of buffer 1155 measured by monitoring unit 1180, and may provide PMIC 1200 with a voltage level signal SVL indicating the adjusted voltage level. In some example embodiments, power management unit 1130 may adjust the voltage level of the at least one of the first and second high power supply voltages such that a sum of the leakage current of the first transistor T1 and the leakage current of buffer 1155 is minimized. PMIC 1200 may provide the first and second power supply lines VDD and VDDH with the first and second high power supply voltages having appropriate voltage levels based on the voltage level signal SVL.

Figure 11:
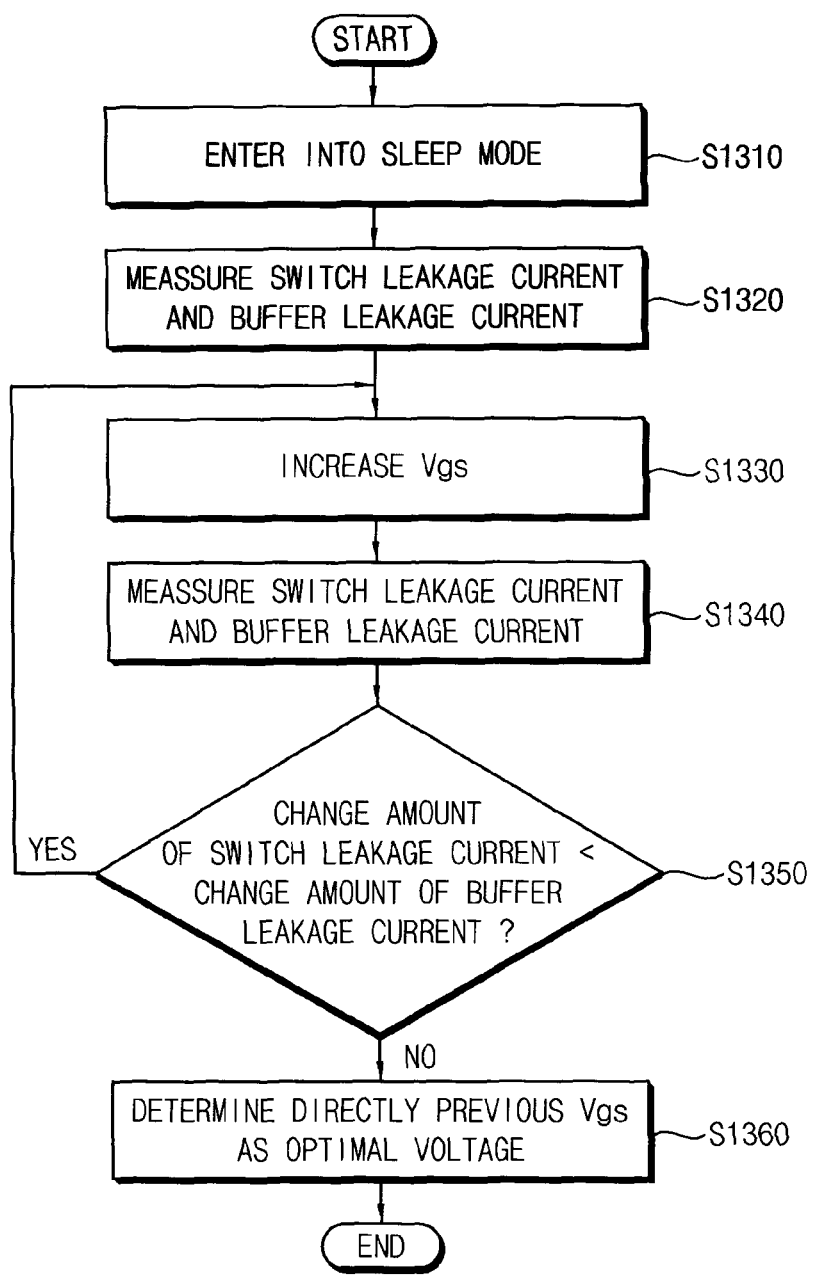
FIG. 11 is a flowchart illustrating an example of a method of determining a gate-source voltage of a power cut-off switch according to example embodiments.

FIG. 11 is a flowchart illustrating an example of a method of determining a gate-source voltage of a power cut-off switch according to example embodiments.

Referring to FIGS. 9 and 11, when integrated circuit 900 enters into a sleep mode (S1310), monitoring unit 1180 may measure a leakage current of the first transistor T1 and a leakage current of buffer 1155 (S1320).

Power management unit 1130 may control PMIC 1200 to increase (or decrease) a gate-source voltage (Vgs) of a power cut-off switch T1 (S1330), and monitoring unit 1180 may again measure the leakage current of the first transistor T1 and the leakage current of buffer 1155 (S1340).

If a change amount of the leakage current of the power cut-off switch T1 is less than a change amount of the leakage current of buffer 1155 (S1350: YES), power management unit 1130 may control the PMIC 1200 to increase (or decrease) the gate-source voltage of the power cut-off switch T1 (S1330), and monitoring unit 1180 may again measure the leakage current of the first transistor T1 and the leakage current of buffer 1155 (S1340).

If the change amount of the leakage current of the power cut-off switch T1 is greater than or equal to the change amount of the leakage current of the buffer 1155 (S1350: NO), power management unit 1130 may determine the directly previous gate-source voltage as an optimal voltage, and may control PMIC 1200 to decrease (or increase) the gate-source voltage of the power cut-off switch T1 to the optimal voltage (S1360). PMIC 1200 may provide integrated circuit 1100 with the first and second high power supply voltages corresponding to the determined optimal voltage.

Figure 12:
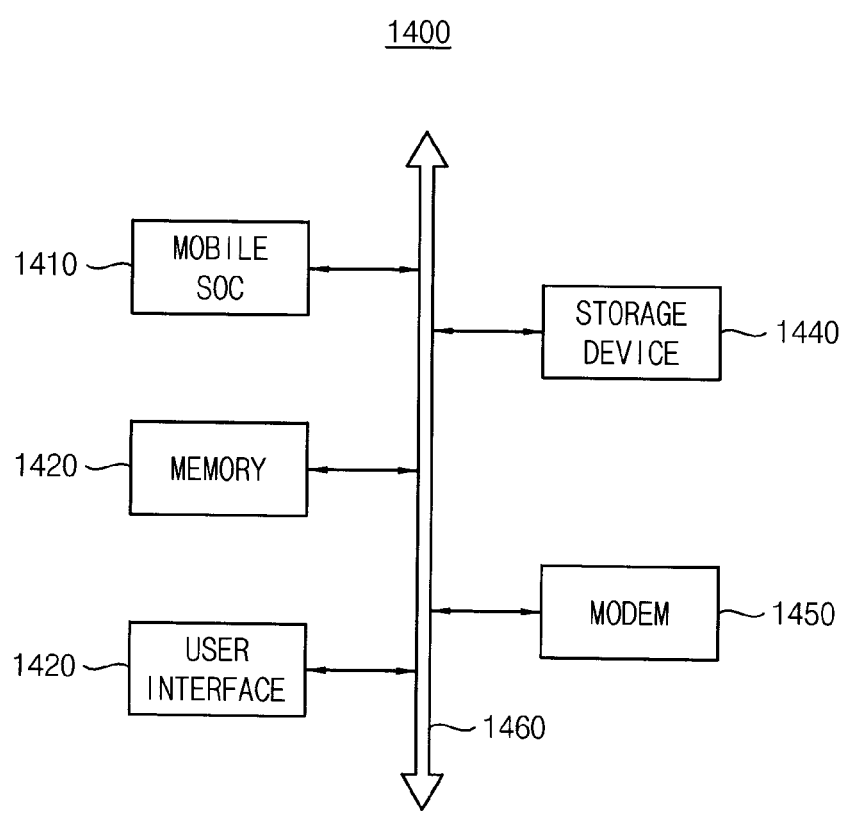
FIG. 12 is a diagram illustrating a computing system according to example embodiments.

FIG. 12 is a diagram illustrating a computing system 1400 according to example embodiments.

Referring to FIG. 12, computing system 1400 includes a processor 1410 (e.g., a mobile SOC), a memory device 1420, a user interface 1430, a storage device 1440, a modem 1450 (e.g., a baseband chipset) and a bus 1460.

Processor 1410 may perform specific calculations or tasks. Processor 1410 may be an SOC including a power gating circuit according to example embodiments. For example, processor 1410 may be a mobile SOC, an application processor, a media processor, a microprocessor, a CPU, or the like. Processor 1410 may be coupled to memory device 1420 via bus 1460, such as an address bus, a control bus and/or a data bus. For example, memory device 1420 may be implemented by a dynamic random access memory (DRAM), a mobile DRAM, a static random access memory (SRAM), a phase random access memory (PRAM), a ferroelectric random access memory (FRAM), a resistive random access memory (RRAM), a magnetic random access memory (MRAM), or the like. Further, processor 1410 may be coupled to an extension bus, such as a peripheral component interconnect (PCI) bus, and may control user interface 1430 including at least one input device, such as a keyboard, a mouse, a touch screen, etc., and at least one output device, a printer, a display device, etc. Processor 1410 may further control storage device 1440, such as a solid state drive, a hard disk drive, a CD-ROM, etc. Modem 1450 may perform wired or wireless communication with an external device. In some example embodiments, computing system 1400 may further include a power supply, an application chipset, a camera image processor (CIS), etc.

Processor 1410 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

According to example embodiments, computing system 1400 may be any computing system, such as a cellular phone, a smart phone, a tablet computer, a desktop computer, a laptop computer, a music player, a personal digital assistants (PDA), a portable multimedia player (PMP), a digital television, a digital camera, a portable game console, etc.

The inventive concept may be applied to any semiconductor device including a power gating circuit. For example, the inventive concept may be applied to a mobile SOC, an application processor, a media processor, a microprocessor, a CPU, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A power gating circuit in an integrated circuit including a circuit block coupled to a virtual power supply line, the power gating circuit comprising:
   a first transistor coupled between a first power supply line and the virtual power supply line, the first transistor having a body coupled to the first power supply line; and
   a buffer configured to buffer a control signal to apply the buffered control signal to the first transistor, the buffer including a second transistor having a source coupled to a second power supply line and a body coupled to the first power supply line, wherein either a first high power supply voltage is applied to the first power supply line and a second high power supply voltage which is greater than the first high power supply voltage is applied to the second power supply line, or a first low power supply voltage is applied to the first power supply line, and a second low power supply voltage which is less than the first low power supply voltage is applied to the second power supply line.

2. The power gating circuit of claim 1, wherein a voltage difference between a first power supply voltage applied to the first power supply line and a second power supply voltage applied to the second power supply line is selected based on a leakage current of the first transistor and a leakage current of the buffer.

3. The power gating circuit of claim 1, wherein the first transistor and the second transistor are formed at the same well in a semiconductor substrate.

4. The power gating circuit of claim 1, wherein the first transistor is configured to selectively couple the first power supply line to the virtual power supply line in response to the buffered control signal.

5. The power gating circuit of claim 1, wherein the first transistor further has a source coupled to the first power supply line, a drain coupled to the virtual power supply line, and a gate configured to receive the buffered control signal from the buffer.

6. The power gating circuit of claim 1, wherein the buffer is configured to apply a power supply voltage of the second power supply line as the buffered control signal to a gate of the first transistor when the control signal has a first logic level.

7. The power gating circuit of claim 1, wherein the second transistor further has a drain coupled to a gate of the first transistor, and a gate, and
wherein the buffer further includes:
a third transistor having a source coupled to a third power supply line, a drain coupled to the gate of the first transistor, and a gate;
a fourth transistor having a source coupled to the second power supply line, a drain coupled to the gate of the second transistor and the gate of the third transistor, and a gate receiving the control signal; and
a fifth transistor having a source coupled to the third power supply line, a drain coupled to the gate of the second transistor and the gate of the third transistor, and a gate receiving the control signal.

8. An integrated circuit, comprising:
a circuit block coupled to a virtual power supply line;
a power management unit configured to generate a control signal; and
a power gating circuit configured to selectively couple a first power supply line to the virtual power line in response to the control signal, the power gating circuit comprising:
a first transistor coupled between the first power supply line and the virtual power supply line, the first transistor having a body coupled to the first power supply line; and
a buffer configured to buffer the control signal to apply the buffered control signal to the first transistor, the buffer including a second transistor having a source coupled to a second power supply line and a body coupled to the first power supply line,
wherein either a first high power supply voltage is applied to the first power supply line and a second high power supply voltage which is greater than the first high power supply voltage is applied to the second power supply line, and the buffer applies the second high power supply voltage as the buffered control signal to a gate of the first transistor when the control signal has a first logic level, or a first low power supply voltage is applied to the first power supply line and a second low power supply voltage which is less than the first low power supply voltage is applied to the second power supply line, and the buffer applies the second low power supply voltage as the buffered control signal to a gate of the first transistor when the control signal has the first logic level.

9. The integrated circuit of claim 8, wherein a voltage level of at least one of a first power supply voltage applied to the first power supply line and a second power supply voltage applied to the second power supply line is adjusted when testing the integrated circuit such that a sum of a leakage current of the first transistor and a leakage current of the buffer is reduced.

10. The integrated circuit of claim 9, further comprising:
a nonvolatile memory configured to store the adjusted voltage level,
wherein the power supply voltages having the adjusted voltage level stored in the nonvolatile memory are applied to the first and second power supply lines when operating the integrated circuit.

11. The integrated circuit of claim 8, further comprising:
a monitoring unit configured to measure a leakage current of the first transistor and a leakage current of the buffer,
wherein the power management unit is configured to adjust a voltage level of at least one of a first power supply voltage applied to the first power supply line and a second power supply voltage applied to the second power supply line such that a sum of the leakage current of the first transistor and the leakage current of the buffer measured by the monitoring unit is reduced.

12. An integrated circuit, including:
a circuit block coupled between a virtual power supply line and a third power supply line; and
a power gating circuit, comprising:
a first transistor having: a first terminal coupled to a first power supply line, a second terminal coupled to the virtual power supply line, a gate, and a body coupled to the first power supply line; and
a buffer configured to buffer a control signal to apply the buffered control signal to the gate of the first transistor, the buffer including a second transistor having a source coupled to a second power supply line and a body coupled to the first power supply line,
wherein either a first high power supply voltage is applied to the first power supply line, a second high power supply voltage which is greater than the first high power supply voltage is applied to the second power supply line, and a low power supply voltage which is less than the first high power supply voltage is applied to the third power supply line, or
wherein a first low power supply voltage is applied to the first power supply line, a second low power supply voltage which is less than the first low power supply voltage is applied to the second power supply line, and a high power supply voltage which is greater than the first low power supply voltage is applied to the third power supply line.

13. The integrated circuit of claim 12, further comprising:
a power management unit configured to supply the control signal to the buffer; and
a memory device configured to store therein information identifying a voltage difference between a first voltage to be applied to the a first power supply line and a second voltage to be applied to the second power supply line so as to minimize a total leakage current of the first transistor and the buffer in a sleep mode for the circuit block.

14. The integrated circuit of claim 12, further comprising:
a power management unit configured to supply the control signal to the buffer; and
a monitoring unit including:
   a first leakage measuring unit configured to measure a leakage current of the first transistor when the circuit block is in a sleep mode, and
   a second leakage measuring unit configured to measure a leakage current of the buffer when the circuit block is in the sleep mode.

\* \* \* \* \*